(12) United States Patent
Takeyama et al.

(10) Patent No.: US 7,687,708 B2
(45) Date of Patent: Mar. 30, 2010

(54) PHOTOVOLTAIC CELL HAVING A COATING FILM PROVIDED ON A PHOTOVOLTAIC ELEMENT AND MANUFACTURING METHOD THEREOF

(75) Inventors: Yoshifumi Takeyama, Kyoto (JP); Hirokazu Fujino, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 1112 days.

(21) Appl. No.: 10/754,597

(22) Filed: Jan. 12, 2004

(65) Prior Publication Data

US 2004/0144420 A1    Jul. 29, 2004

(30) Foreign Application Priority Data

Jan. 23, 2003   (JP)   ............... 2003-014211

(51) Int. Cl.
*H01L 31/00*   (2006.01)
(52) U.S. Cl. ............... 136/256; 136/251; 136/252; 136/259; 438/98
(58) Field of Classification Search ........... 136/251, 136/256, 252, 259; 438/73, 98
See application file for complete search history.

(56) References Cited

U.S. PATENT DOCUMENTS

| | | | | |
|---|---|---|---|---|
| 4,260,429 A | | 4/1981 | Moyer | 136/256 |
| 5,391,235 A | * | 2/1995 | Inoue | 136/244 |
| 5,611,884 A | * | 3/1997 | Bearinger et al. | 156/325 |
| 5,650,019 A | * | 7/1997 | Yamada et al. | 136/251 |
| 5,660,646 A | * | 8/1997 | Kataoka et al. | 136/251 |
| 5,667,596 A | | 9/1997 | Tsuzuki et al. | 136/256 |
| 5,679,176 A | | 10/1997 | Tsuzuki et al. | 136/251 |
| 5,759,291 A | | 6/1998 | Ichinose et al. | 136/256 |
| 5,800,631 A | * | 9/1998 | Yamada et al. | 136/251 |
| 5,942,048 A | | 8/1999 | Fujisaki et al. | 136/256 |
| 5,973,258 A | * | 10/1999 | Shiotsuka et al. | 136/252 |
| 6,121,542 A | * | 9/2000 | Shiotsuka et al. | 136/256 |
| 6,130,379 A | | 10/2000 | Shiotsuka et al. | 136/251 |
| 6,162,986 A | | 12/2000 | Shiotsuka et al. | 136/244 |
| 6,175,075 B1 | * | 1/2001 | Shiotsuka et al. | 136/251 |
| 6,180,868 B1 | | 1/2001 | Yoshino et al. | 136/244 |
| 6,184,457 B1 | | 2/2001 | Tsuzuki et al. | 136/256 |
| 6,184,458 B1 | | 2/2001 | Murakami et al. | 136/256 |
| 6,191,353 B1 | | 2/2001 | Shiotsuka et al. | 136/256 |
| 6,204,443 B1 | * | 3/2001 | Kiso et al. | 136/259 |
| 6,271,462 B1 | | 8/2001 | Tsuzuki et al. | 136/290 |
| 6,291,763 B1 | * | 9/2001 | Nakamura | 136/256 |
| 6,316,832 B1 | | 11/2001 | Tsuzuki et al. | 257/747 |
| 6,479,744 B1 | | 11/2002 | Tsuzuki et al. | 136/256 |
| 6,511,861 B2 | * | 1/2003 | Takeyama et al. | 438/73 |

(Continued)

FOREIGN PATENT DOCUMENTS

JP        7-321353        12/1995

(Continued)

*Primary Examiner*—Alexa D Neckel
*Assistant Examiner*—Golam Mowla
(74) *Attorney, Agent, or Firm*—Fitzpatrick, Cella, Harper & Scinto (57) ABSTRACT

In a photovoltaic cell composed of a photovoltaic element and a coating film provided thereon, the photovoltaic element has an electrode portion or portions having a thickness larger than the average thickness of the coating film, and in addition, the thickness of the coating film which is in contact with the electrode portion or portions is equal to or smaller than the average thickness described above.

14 Claims, 4 Drawing Sheets

U.S. PATENT DOCUMENTS

| | | | |
|---|---|---|---|
| 6,515,218 B1 | 2/2003 | Shimizu et al. | 136/256 |
| 6,664,597 B2 | 12/2003 | Takeyama et al. | 257/347 |
| 6,984,804 B2 * | 1/2006 | Takeyama et al. | 219/121.85 |
| 2002/0140079 A1 | 10/2002 | Takeyama | 257/698 |
| 2002/0185170 A1 * | 12/2002 | Shiotsuka et al. | 136/251 |
| 2003/0134048 A1 * | 7/2003 | Shiotsuka et al. | 427/421 |

FOREIGN PATENT DOCUMENTS

| | | |
|---|---|---|
| JP | 8-139349 | 5/1996 |
| JP | 9-18034 | 1/1997 |
| JP | 9-36396 | 2/1997 |
| JP | 9-92759 | 4/1997 |
| JP | 10-65192 | 3/1998 |
| JP | 10-233519 | 9/1998 |

* cited by examiner

PHOTOVOLTAIC CELL HAVING A COATING FILM PROVIDED ON A PHOTOVOLTAIC ELEMENT AND MANUFACTURING METHOD THEREOF

BACKGROUND OF THE INVENTION

1. Field of the Invention

The present invention relates to a photovoltaic cell which has a transparent coating film on a light receiving face of a photovoltaic element for preventing photovoltaic element properties from being degraded by scratches, moisture, and the like.

2. Description of the Related Art

In recent years, a greenhouse effect, that is, global warming caused by increase in amount of $CO_2$, has became a serious problem, and hence development of clean energy sources which will not discharge $CO_2$ at all has been increasingly required. As one of the energy sources described above, for example, nuclear power generation may be mentioned; however, since various problems thereof, such as radioactive wastes, must be solved, development of safer clean energy sources has been further required.

Accordingly, among various clean energy sources which are expected in the future, solar cells have drawn significant attention because of their cleanness, highly reliable safety properties, and easy handling.

At present, various solar cells have been proposed, and some of them have actually been used as an electrical source. The solar cells mentioned above are roughly categorized into a crystal silicon-based solar cell using single crystal or polycrystal silicon, an amorphous silicon-based solar cell using amorphous silicon, and a compound semiconductor solar cell.

In general, a solar cell is used as a solar cell module in which a photovoltaic element is covered with a transparent coating material for protection. This surface coating material provided at a topmost surface is composed of a glass or a transparent fluorinated resin formed of a fluorinated resin film, a fluorinated resin paint, or the like, and a seal composition material is provided thereunder. In general, as the seal composition material, various transparent thermoplastic resin compositions are used.

The reasons a glass substrate is used at the topmost surface are that a glass substrate has superior moisture resistance, scratch resistance, and weather resistance and that a decrease in conversion efficiency of a solar cell module which is caused by decrease in transmittance due to degradation can be suppressed. In particular, as for scratch resistance, a glass substrate may be regarded as one of the most superior materials since it mechanically protects a photovoltaic element without causing any damage thereto. However, a glass substrate has several problems, such as heavy weight, inflexibility, poor impact strength, and high cost, and in particular, the heavy weight has serious influence on an installation structure of the solar cell module.

In addition, due to various installation structures of solar cell modules and output requirements of current, voltage, and the like, the external form of a solar cell module is considerably changed. On the other hand, in general, several types of external forms of photovoltaic elements have been standardized, and in accordance with the structure of a solar cell module, a plurality of photovoltaic elements are connected to each other to form a desired structure. That is, depending on the production schedule or the like for a solar cell module, photovoltaic elements may be temporarily stored or transported in some cases after being formed.

When being stored or transported as described above, the photovoltaic element is not covered with a coating material, and hence properties of the photovoltaic element are degraded by moisture and/or scratches, thereby causing decrease in production yield. For protection of photovoltaic elements in a production process, as disclosed, for example, in Japanese Patent Laid-Open Nos. 9-36396, 9-92759, and 10-233519, a thin film resin layer used as a protection coating may be provided for the photovoltaic element immediately after the production thereof to form a photovoltaic cell.

A typical photovoltaic element structure has a semiconductor layer having a pn junction; a light receiving electrode made of a transparent conductive oxide provided on a light receiving face of the semiconductor layer; a collector electrode which is formed of a relatively thin metal for collecting current and which is provided on the light receiving electrode; and an electrode formed of a relatively thick metal called a bus bar for collecting current collected by the collector electrode.

As an electrode structure of a photovoltaic element, for example, according to U.S. Pat. No. 4,260,429, an electrode has been proposed which is composed of a polymer containing conductive particles and a metal wire coated therewith. According to this patent, since a metal wire made of copper or the like having superior conductivity is used, electrical resistance loss can be reduced even when a long collector electrode is formed, and in addition, since an aspect ratio of 1 to 1 can be realized, the shadow loss can also be reduced. In addition, according to this patent, by using a conductive adhesive for fixing the wire, bonding can be advantageously performed by simple thermo-compression bonding. The inventors of the present invention improved the collector electrode made of the metal wire described above and proposed an electrode structure of a photovoltaic element as disclosed in Japanese Patent Laid-Open Nos. 7-321353, 9-18034, and 10-65192.

Figure 5A:
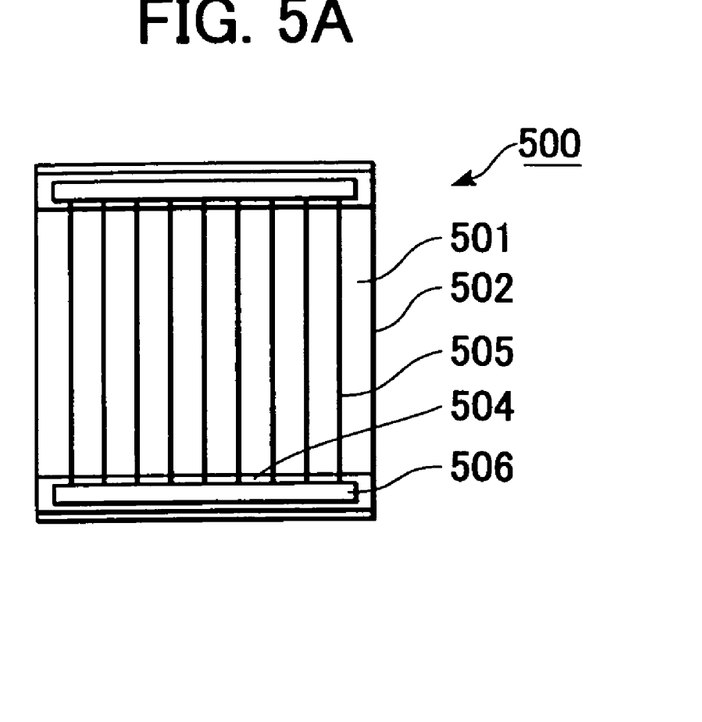
FIGS. 5A and 5B are schematic views for illustrating a related photovoltaic element.
Figure 5B:
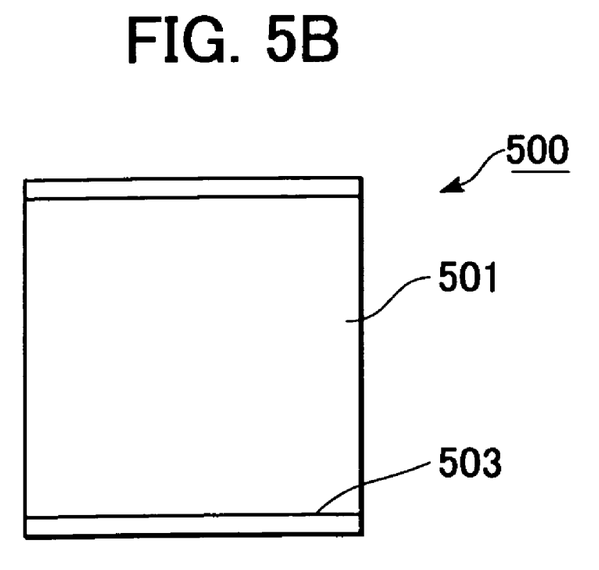

One example of a method for forming the electrodes of a photovoltaic element will be described with reference to FIGS. 5A and 5B. FIGS. 5A and 5B are schematic views each showing the structure of a photovoltaic element having collector electrodes using metal wires; FIG. 5A is a schematic view of the photovoltaic element when viewed from a light receiving face side; and FIG. 5B is a schematic view of the photovoltaic element when viewed from a non-light receiving face side.

In FIGS. 5A and 5B, reference numeral 501 indicates a photovoltaic element plate composed of a substrate and three layers provided thereon, the three layers being a lower electrode layer, an amorphous silicon layer responsible for a photovoltaic function, and an upper electrode layer. The collector electrodes are to be formed on this photovoltaic element plate 501.

In this photovoltaic element plate 501, aluminum (Al) and zinc oxide (ZnO) are formed in that order on a stainless steel substrate supporting the entire photovoltaic element plate 501 by sputtering so that each has a thickness of several hundreds nanometers, thereby forming the lower electrode layer. In addition, an n-type, an i-type, a p-type, an n-type, an i-type, and a p-type layer are deposited in that order from the substrate side by plasma CVD to form the amorphous silicon layer. In addition, the upper electrode layer is formed of a transparent electrode film, and an indium oxide thin film is formed by depositing indium (In) in an oxygen atmosphere by resistance heating.

Furthermore, in order to avoid the adverse influence of short circuiting between the substrate and the transparent electrode film on an effective light receiving area, which short circuiting occurs when the outer periphery of the photovoltaic element plate 501 is cut, after an etching paste containing $FeCl_3$, $AlCl_3$, or the like is applied onto the transparent electrode film by screen printing, followed by heating, washing is performed so that parts of the transparent electrode film of the photovoltaic element plate 501 are linearly removed, thereby forming etching lines 502.

Subsequently, copper foil strips used as rear-side conductive foil bodies 503 are formed along two sides of the non-light receiving face side of the photovoltaic element plate 501 by a method disclosed in Japanese Patent Laid-Open No. 8-139349.

Next, onto two sides facing the rear-side conductive foil bodies 503 provided on the non-light receiving face of the photovoltaic element plate 501, insulating member 504 composed of a base plate made of polyimide and acrylate adhesives provided on both sides thereof are adhered.

Next, metal wires 505 each formed of a copper wire coated with a conductive adhesive composed of a carbon paste beforehand are continuously formed on the photovoltaic element plate 501 and the insulating members 504 at predetermined intervals, thereby forming the collector electrodes.

Furthermore, on the insulating members 504, conductive foil bodies 506 are formed which are used as additional collector electrodes for the collector electrodes described above. In particular, after copper foil strips are placed, the entirety is then fixed by applying heat and pressure thereto under predetermined conditions.

Figure 6:
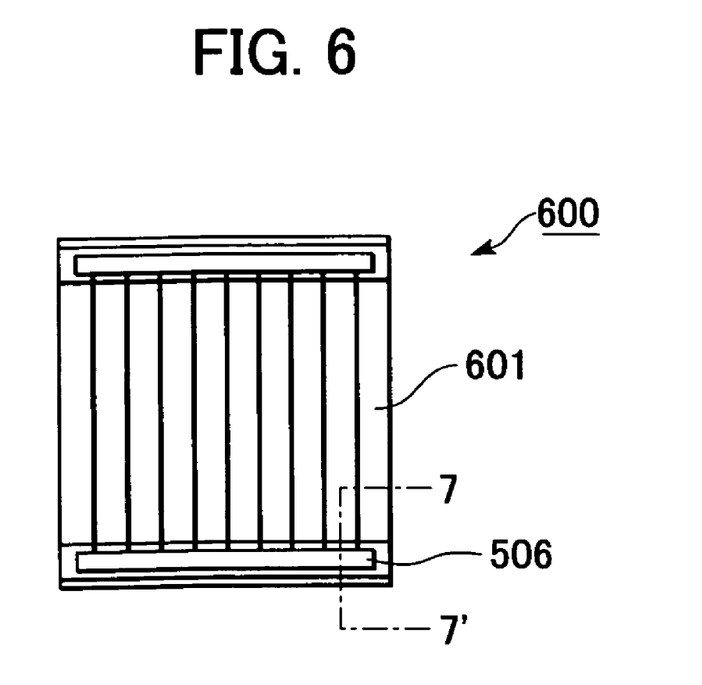
FIG. 6 is a schematic view for illustrating a related photovoltaic cell.

On the light receiving face of a photovoltaic element 500 formed in accordance with the steps described above, surface protection coating is performed. One example in which a surface protection coating film is provided for the photovoltaic element 500 which has the collector electrodes made of the metal wires will be described with reference to FIG. 6. FIG. 6 is a schematic view showing a photovoltaic cell composed of the photovoltaic element and a coating film provided thereon when it is viewed from the light receiving face side. In FIG. 6, reference numeral 601 indicates a surface protection coating film which is formed by applying a predetermined coating solution by spraying coating to a power generation region of the photovoltaic element, followed by heating for curing.

By the method described above, a photovoltaic cell 600 can be formed. In the photovoltaic cell 600, even on the light receiving face of the photovoltaic element, for example, the coating film 601 is not applied to the conductive foil bodies 506 in order to mount backflow prevention diodes or the like thereon in a subsequent step. That is, the surface protection coating film is provided only in the power generation region of the photovoltaic element.

Figure 7:
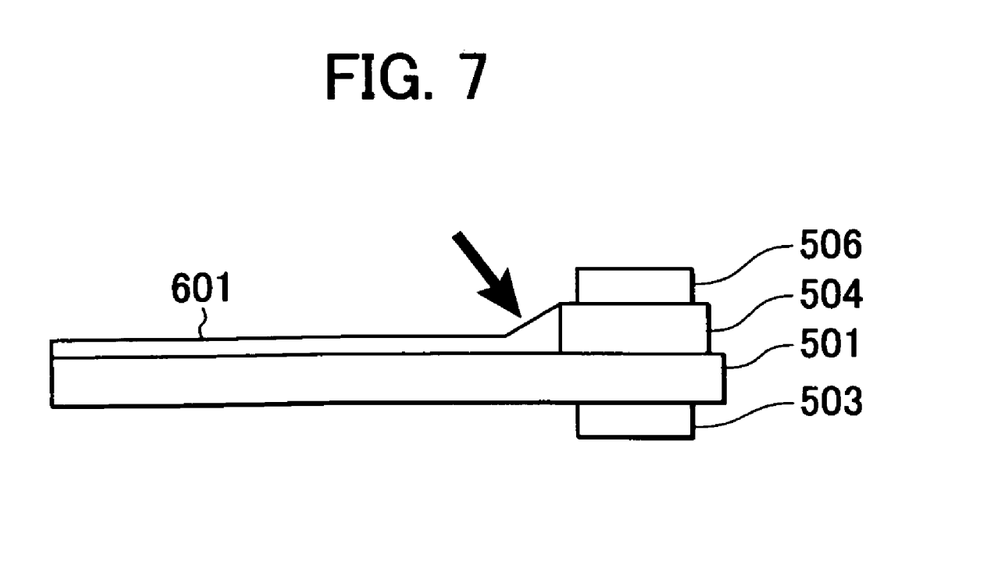
FIG. 7 is a schematic cross-sectional view for illustrating an electrode portion of a related photovoltaic cell.

Objects of the present invention will be described with reference to FIG. 7. FIG. 7 is a schematic cross-sectional view of the photovoltaic cell taken along the line 7-7' in FIG. 6.

On the light receiving face of the photovoltaic element described above, the insulating members 504, the conductive foil bodies 506, and the like are placed, and in the power generation region of the photovoltaic element, the surface protection coating film 601 is provided. In the step described above, since the heights of the insulating member 504, the conductive foil body 506, and the like are larger than the average height of the surface protection coating film 601, due to the surface tension or the like, the thickness of the surface protection coating film (indicated by the arrow in FIG. 7) in the vicinity of the insulating member 504 becomes considerably larger than the average thickness described above.

In the state described above, when the surface protection coating film 601 is dried for curing, a problem occurs in that internal bubbles are generated in the surface protection coating film 601 in the vicinity of the insulating member 504. That is, since drying conditions for curing the surface protection coating film 601 are set in consideration of the average film thickness thereof, at a part of the surface protection coating film 601 having a larger thickness, a solvent contained therein cannot be removed by evaporation within a predetermined drying time. Hence, it is believed that even after the curing of the coating film has started, the solvent is still being evaporated, and as a result, internal bubbles are generated in the surface protection coating film 601.

Since the internal bubbles described above are generated in the power generation region of the photovoltaic cell, optical properties are degraded, the properties of the photovoltaic cell are degraded, and in addition, due to the cosmetic defects, the yield is also reduced.

As a method for solving the problems described above, it may be considered that the drying time is increased; however, in order to prevent the generation of internal bubbles at a place at which the thickness of the coating film is large, the drying time must be several times that performed in the past, and in addition, the drying temperature must be precisely controlled. Accordingly, in the case of a photovoltaic cell having a large area such as 200 mm by 250 mm, the method described above cannot actually solve the above problem. In addition, when the drying time is greatly increased, yellow discoloration of the coating film may occur, thereby causing degradation of optical properties such as transmittance.

SUMMARY OF THE INVENTION

The present invention was made to solve the problems described above, and in accordance with one aspect of the present invention, there is provided a photovoltaic cell comprising: a photovoltaic element; and a coating film provided thereon, wherein the photovoltaic element has an electrode portion having a thickness larger than the average thickness of the coating film, and the thickness of a part of the coating film which is in contact with the electrode portion is equal to or smaller than the average thickness.

According to the structure described above, even when the photovoltaic cell has an electrode portion composed, for example, of an insulating member and a conductive foil body, and having a thickness larger than the average thickness of the surface protection coating film, since the thickness of the surface protection coating film in the vicinity of the electrode portion is formed to be equal to or smaller than the average thickness described above, even in drying the surface protection coating film for curing, internal bubbles are not generated in the vicinity of the electrode portion, and as a result, a photovoltaic cell having a superior appearance can be realized.

That is, when a coating material is applied onto the photovoltaic element, by suppressing the capillary phenomenon of the coating material caused, for example, by metal wires coated with an conductive adhesive and/or by reducing the surface tension of a part of the sidewall of each electrode portion, such as the insulating member and the conductive foil body, which is located at a position higher than the average thickness of the coating material, the coating thickness in the vicinity of each electrode portion can be reduced to a level equal to or smaller than the average thickness of the coating film, and hence the generation of internal bubbles can be suppressed. In particular, a known release agent, antifoaming agent, or surfactant having functions, for example, of reducing the surface tension for suppressing the generation of internal bubbles is applied to the electrode portion, such as the insulating member and the conductive foil body, or a known release agent or surfactant reducing the surface tension is placed at least at a part of the sidewall of the electrode portion of the photovoltaic element which is in contact with the coating material.

In the photovoltaic cell of the present invention described above, when the coating film described above comprises a thermosetting coating material, and the coating material before curing has a viscosity in the range of from 1 to 50 mPa·s, a superior effect can be obtained.

In addition, when the coating film of the present invention has an average thickness of 0.5 mm or less, a superior effect can be obtained.

When the coating film of the present invention described above comprises a coating material containing at least an acrylic resin, a superior effect can be obtained.

In addition, when the electrode portion has at least an insulating member and a conductive foil body, a superior effect can be obtained.

When the insulating member of the present invention described above has at least one acrylic adhesive layer, a superior effect can be obtained.

In addition, the insulating member of the present invention described above located at a position at least higher than the average thickness of the coating film has a low wettability to the coating material.

According to the structure described above, the surface tension of the insulating member in contact with the coating material can be reduced, the coating thickness in the vicinity of the electrode portion can be reduced to a level equal to or smaller than the average thickness, and as a result, the generation of internal bubbles in the coating film can be suppressed. In particular, for example, release treatment may be performed for the insulating member of the photovoltaic element.

In addition, in accordance with another aspect of the present invention, there is provided a method for manufacturing a photovoltaic cell having a photovoltaic element and a coating film provided thereon. The method described above comprises: a step of forming a coating film on a light receiving face of the photovoltaic element by application; and a step of heating the coating film for curing while a part thereof in contact with an electrode portion of the photovoltaic element is being maintained equal to or smaller than the average thickness of the coating film.

According to the method described above, internal bubbles are not generated in the vicinity of the electrode portion, and as a result, a photovoltaic cell having a superior appearance can be realized.

Further objects, features and advantages of the present invention will become apparent from the following description of the preferred embodiments with reference to the attached drawings.

DESCRIPTION OF THE PREFERRED EMBODIMENTS

Hereinafter, embodiments of the present invention will be described with reference to drawings.

Figure 1A:
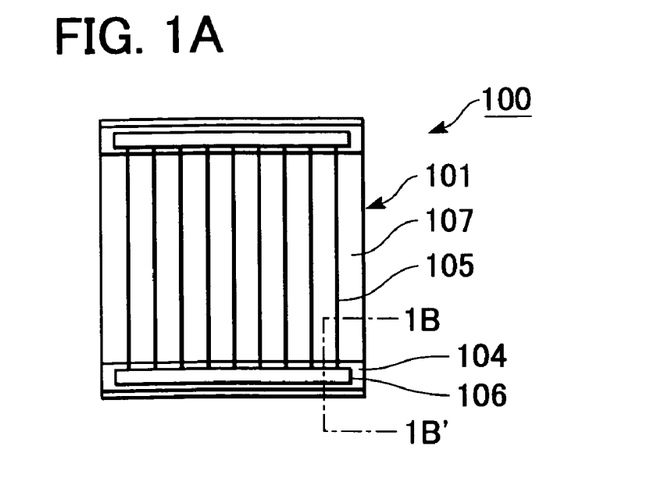
FIGS. 1A and 1B are schematic views for illustrating a photovoltaic cell of example 1 according to the present invention.
Figure 1B:
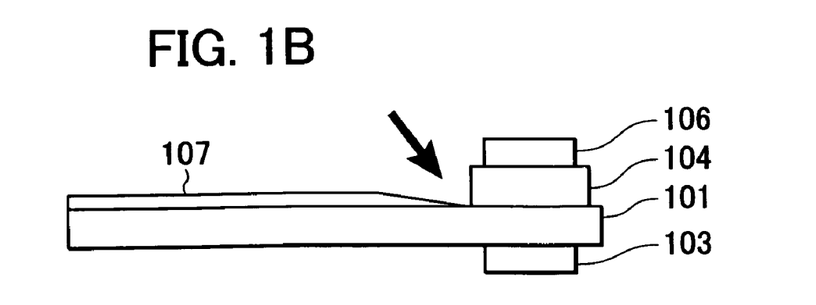
Figure 2:
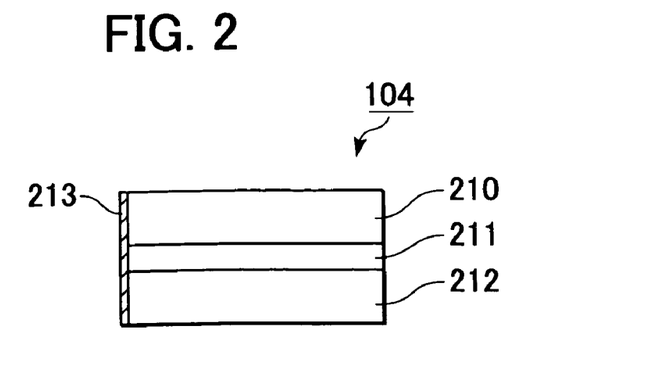
FIG. 2 is a schematic cross-sectional view for illustrating an insulating member of example 1 according to the present invention.

FIGS. 1A, 1B, and 2 are schematic views for illustrating an example of a photovoltaic cell according to the present invention; FIG. 1A is a schematic view of a photovoltaic cell having collector electrodes formed of metal wires when it is viewed from a light receiving face side, and FIG. 1B is a schematic cross-sectional view of the photovoltaic cell taken along the line 1B-1B' in FIG. 1A.

In FIGS. 1A and 1B, reference numeral 101 indicates a plate forming a photovoltaic element, which is composed of a substrate and three layers provided thereon, the three layers being a lower electrode layer, a semiconductor layer responsible for a photovoltaic function, and an upper electrode layer, and this plate will be referred to as a "photovoltaic element plate". The collector electrodes are to be formed on this photovoltaic element plate.

For forming a photovoltaic cell 100, in order to avoid the adverse influence of short circuiting between the substrate and the upper electrode layer (which is formed of a transparent electrode film) on an effective light receiving area, which short circuiting occurs when the outer periphery of the photovoltaic element plate 101 is cut, first of all, parts of the transparent electrode film of the photovoltaic element plate 101 are linearly removed, thereby forming etching lines (not shown).

Subsequently, along two sides of a non-light receiving face of the photovoltaic element plate 101, copper foil strips used as rear-side conductive foil bodies 103 are formed.

Next, insulating members 104 are adhered to two sides which face the rear-side conductive foil bodies 103 provided at the end portions of the non-light receiving face. A part of each of the insulating members 104, which is to be located at a position at least higher than the average thickness of a coating film which will be described later, is processed by release treatment. Due to the surface tension of a sidewall of the insulating member 104 obtained by this release treatment, a coating material forming the coating film in the vicinity of the insulating member 104 will not ascend along the sidewall described above and in addition is repelled therefrom, and as a result, the thickness of the coating material is reduced.

Besides the method described above, a method is also preferably performed in which after the insulating members 104 are adhered to the photovoltaic element plate 101, a silicone release agent is applied. When a silicone release agent is applied after the insulating member 104 are adhered to the photovoltaic element plate 101, the silicone release agent may be mixed with a surface protection coating film 107 in the vicinity of the insulating member 104, followed by curing.

Next, collector electrodes 105 are each formed continuously on the photovoltaic element plate 101 and the insulating members 104. In addition, conductive foil bodies 106, each of which serves as an additional collector electrode for the collector electrodes 105, are formed on the insulating members 104, thereby forming a photovoltaic element.

Next, surface protection coating is performed on the light receiving face of the photovoltaic element. Reference numeral 107 indicates a surface protection coating film, and at least a power generation region of the photovoltaic element is covered therewith.

When a surface protection coating material is applied, by the release treatment processed for the insulating member 104, the coating material in the vicinity of the insulating member 104 is repelled, and as a result, the thickness of the surface protection coating film (indicated by the arrow in FIG. 1B) in the vicinity of the insulating member 104 is reduced. The coating material thus applied is then cured, thereby forming the photovoltaic cell 100.

By the structure and the method described above, without generating any internal bubbles in the vicinity of the electrode portion, the surface protection coating can be performed for the photovoltaic element.

The photovoltaic element described in the present invention is preferably applied to an amorphous silicon photovoltaic element used for photoelectric sensors, photodiodes, solar cells, and the like. In addition to the amorphous silicon photovoltaic element, the structure equivalent to that described above may also be applied to photovoltaic elements using semiconductors made of single crystal silicon, polycrystal silicon, and materials other than silicon, such as a compound semiconductor and a Schottky junction semiconductor.

Hereinafter, members forming the photovoltaic cell 100 according to the embodiment of the present invention will be described in detail.

(Substrate)

When a thin photovoltaic element is formed, for example, of SOI single crystal silicon or amorphous silicon, the substrate forming the photovoltaic element plate 101 is used as a member for mechanically supporting a semiconductor layer and may also be used as an electrode in some cases. For example, when a semiconductor layer, such as a silicon wafer having a thickness of 200 μm or more, has a sufficient mechanical strength, the substrate is not particularly required. Depending on the type of photovoltaic element, the substrate may be required in some cases to have heat resistance against a heating temperature in forming a semiconductor layer, and for the substrate, both electrical conductive and insulating materials may be used.

As the electrical conductive materials, for example, there may be mentioned a metal, such as Fe, Ni, Cr, Al, Mo, Au, Nb, Ta, V, Ti, Pt, or Pb; an alloy thereof such as a thin plate made of brass or stainless steel; and a composite thereof.

In addition, as the electrical insulating materials, for example, there may be mentioned synthetic resins, such as polyester, polyethylene, polycarbonate, cellulose acetate, polypropylene, polyvinyl chloride, polyvinylidene chloride, polystyrene, polyamide, polyimide, and epoxy resins; composites thereof in combination with glass fiber, carbon fiber, boron fiber, metal fiber, and the like; and materials such as glass and ceramic.

(Lower Electrode Layer)

The lower electrode layer is one of the electrodes for collecting electrical power generated in the semiconductor layer and is required to have ohmic contact with the semiconductor layer and the like. As materials for the lower electrode layer, for example, there may be mentioned pure metals and alloys, such as Al, Ag, Pt, Au, Ni, Ti, Mo, Fe, V, Cr, Cu, stainless steel, brass, Nichrome, $SnO_2$, $In_2O_3$, ZnO, ITO (indium tin oxide), and transparent conductive oxide (TCO); and conductive pastes containing the conductive materials described above.

In addition, for example, when the lower electrode layer is provided on the non-light receiving face of the semiconductor layer, texture treatment may be performed for the surface of the lower electrode layer which is in contact with the semiconductor layer so as to cause diffuse reflection.

As a method for forming the lower electrode layer, for example, a known method such as plating, deposition, sputtering, or silk screen printing may be used. In addition, when the substrate is made of a conductive material, the lower electrode may not be provided in some cases.

(Semiconductor Layer)

For the semiconductor layer, known semiconductor materials which have been used for general photovoltaic elements may be used. As a semiconductor material for the photovoltaic element according to the present invention, Group IV semiconductor materials, such as crystal silicon, polycrystal silicon, thin film single crystal silicon, thin film polycrystal silicon, and amorphous silicon; Group II-VI semiconductor materials, such as CdS and CdTe; and Group III-V semiconductor materials such as GaAs may be preferably used. In addition, besides single cells, tandem cells and triple cells, which are each composed of a plurality of pin junctions or pn junctions laminated to each other, are also preferably used. Furthermore, Schottky type semiconductors and organic semiconductors such as a dye-sensitized semiconductor may also be used. As a method for forming the semiconductor layer described above, in the case of an amorphous silicon semiconductor, the semiconductor layer may be formed by introducing a starting gas material such as a silane gas forming a thin film into a plasma CVD furnace which generates plasma discharge. In addition, in the case of a single crystal silicon semiconductor, the semiconductor layer may be prepared by forming a single crystal silicon ingot from molten silicon, for example, using a CZ method, followed by slicing the ingot into a wafer having a desired thickness. In addition, in the case of a GaAs compound semiconductor, the semiconductor layer may be formed, for example, by an electron beam deposition method, a sputtering method, or an electrocrystallization method. Furthermore, in the case of a dye-sensitized semiconductor, the semiconductor layer may be formed by supplying an electrolytic solution between a counter (upper) electrode and a (lower) electrode, which are each composed of an oxide semiconductor and a dye adsorbed thereon.

(Upper Electrode Layer)

The upper electrode layer is an electrode for collecting an electromotive force generated in the semiconductor layer and works together with the lower electrode layer. The upper electrode layer is necessary when a semiconductor having a high sheet resistance, such as an amorphous silicon semiconductor, is used, and when a semiconductor having a low sheet resistance, such as crystal semiconductor, is used, the upper electrode layer may not be particularly required in some cases. In addition, since being located at a light entering side, the upper electrode layer must be transparent and is called a transparent electrode in some cases. The upper electrode layer preferably has a transmittance of 85% or more in order to efficiently absorb light emitted from the sun, white fluorescent lamps, or the like into the semiconductor layer, and in addition, in electrical point of view, the sheet resistance of the upper electrode layer is preferably 300Ω per square or less so that a current generated by light flows in the lateral direction with respect to the semiconductor layer. As a material having the properties described above, for example, metal oxides such as $SnO_2$, $In_2O_3$, ZnO, CdO, $CdSnO_4$, and ITO ($In_2O_3$+$SnO_2$) may be mentioned.

(Etching Line)

The etching lines are lines formed by linearly removing parts of the upper electrode layer, and an object of the etching lines is to avoid the adverse influence of short circuiting on the effective light receiving face, the short circuiting being generated between the substrate and the transparent electrode film (upper electrode layer) in cutting the outer periphery of the photovoltaic element.

As a method for forming the etching lines, for example, there may be mentioned a method in which an etching paste containing $FeCl_3$ or $AlCl_3$ is applied, for example, by silk screen printing, followed by heating; a method in which electrolysis treatment is performed in an electrolytic solution; and a method in which laser irradiation or the like is performed.

(Rear-Side Conductive Foil Body)

The rear-side conductive foil bodies 103 are additional electrodes for the lower electrode layer and work together with the collector electrodes 105 and the conductive foil bodies 106. For the rear-side conductive foil body 103, for example, a metal material having a low resistance, such as Al, Ag, Pt, Au, Ni, or Cu, is preferably used. When the photovoltaic element has no substrate or has an insulating substrate, the rear-side conductive foil body can be electrically connected to the lower electrode layer, for example, with a known conductive adhesive such as an Ag paste or a carbon paste, and when the photovoltaic element has a conductive substrate, the rear-side conductive foil body can be connected to the substrate optionally using a known connecting method such as soldering, brazing, spot welding, laser welding, or adhesion using a conductive adhesive.

(Insulating Member)

The insulating members 104 are each required to have insulating properties for electrically isolating a first electrode side of the photovoltaic element or a region in which performance is not assured from the conductive foil body 106 at a second electrode side, and in addition, whenever necessary, the insulating member 104 is required to mechanically support at least the conductive foil body 106. As the structure of the insulating member, an adhesive may be provided on two surfaces of an insulating base plate, and a so-called double-sided adhesive tape may be used. In addition, the base plate and the adhesive may be repeatedly laminated to each other, and in this case, plural types of base plates and/or plural types of adhesives may be used. Furthermore, by performing release treatment for at least a part of the insulating member, the surface tension of a part thereof which is to be brought into contact with the coating material is reduced, the thickness of the surface protection coating film in the vicinity of the electrode portion of the photovoltaic element is reduced to the average thickness thereof or less, and as a result, the generation of bubbles inside the coating film can be suppressed. The same advantages can be naturally obtained when a material having a low wettability to the coating material is used to form at least a part of the insulating member.

(Base Plate)

The base plate of the insulating member 104 is required to have insulating properties for reliably insulating between the electrodes of the photovoltaic element described above, and a known insulating polymer film may be preferably used. In addition, the base plate preferably has heat resistance against heating for curing a paste, soldering, resistance welding, laser welding, and the like, which are performed when the collector electrodes 105 are connected to the conductive foil bodies 106 or when components such as bypass diodes are mounted which are to be connected to the conductive foil bodies 106.

As constituents of the base plate, for example, there may be mentioned cellophanes, rayons, acetates, polyethylenes, polyethylene terephthalates, polyether ketones, fluorinated resins, polysulfones, unsaturated polyesters, epoxy resins, polyamides, polyimides, polyamide imides, and polyimide silicon resins. Among those constituents mentioned above, polyimides and polyethylene terephthalates are particularly preferable in terms of adhesion properties, low coefficient of thermal expansion, and strengths. The polymer film preferably has a melting point of at least 250° C.

(Adhesive)

As the adhesive provided for the base plate of the insulating member 104, for example, there may be mentioned acrylic, rubber, silicone, polyvinyl ether, epoxy, polyurethane, polyamide, inorganic, and composite adhesives. Among the adhesives mentioned above, a material may be preferably used which has superior adhesiveness, tack property, retentiveness, electric strength, moisture resistance, heat resistance, and the like. Among those mentioned above, an acrylic adhesive is particularly preferable since it is less expensive and has superior adhesiveness and retentiveness. Among various acrylic adhesives, for example, an adhesive using a polymeric acrylic resin has been recently developed which has a weight average molecular weight of 5,000 to 500,000 in terms of the equivalent polystyrene molecular weight, and in addition, the heat resistance has also been improved. As a method for applying an adhesive, for example, a method for applying an adhesive having a predetermined width with an applicator or the like may be mentioned. In accordance with types of adhesives, treatment such as drying, heating, pressure application, or light irradiation may be performed.

(Release Treatment)

The release treatment is required to reduce the surface tension of a part of the insulating member 104 or the like forming the electrode portion, which is to be brought into contact with the coating material, for reducing the thickness of the surface protection coating film in the vicinity of the electrode portion to the average thickness or less and for suppressing the generation of bubbles inside the coating film. For this release treatment, known release agents, antifoaming agents, water repellent agents, surfactants, and the like may be preferably used.

As materials for the release agents, for example, natural fats and oils, synthetic oils, silicone oils, modified silicone oils, and fluorinated materials may be used; as materials for the antifoaming agents, for example, acrylic materials, vinyl materials, silicone oils, fatty acid esters, phosphoric esters, and natural fats and oils may be used; and as materials for the water repellent agents, for example, silicone oils, fluorinated materials, and silane materials may be used. As the surfactants, for example, there may be mentioned ionic surfactants, such as anionic surfactants, cationic surfactants, and amphoteric surfactants, which are ionized when being dissolved in a solvent, and nonionic surfactants which are not ionized. Although depending on types of agents, the release agents described above may also be diluted with solvents such as toluene, xylene, industrial gasoline, isopropyl alcohol, and water and may be used in the form of solution. In particular, in order to obtain an effect of reducing the thickness of the surface protection coating film and to prevent the material used for the release treatment from adhering to areas other than desired areas by diffusion, transfer, or the like, a mixed solution containing the release agent at a concentration of 0.1 to 30 percent by weight is preferably used.

As a coating method of the release agents described above, a known coating method, such as spray coating, dip coating, flow coating, or electrodeposition coating is preferably used, and for example, coating for release treatment may be performed on the side surface of an insulating material in the form of a roll which has a predetermined width obtained by slitting. In addition, the release agent described above may be incorporated into the adhesive of the insulating member. As the method mentioned above, an adhesive mixed with a release agent beforehand may be used for at least one adhesive layer of the insulating member, or after the insulating member is formed, a release agent may be added to an adhesive by applying a solution containing the release agent dissolved in a solvent, followed by drying.

(Collector Electrode)

The collector electrodes 105 are electrodes for collecting the electrical power generated in the semiconductor layer without electrical loss through the upper electrode layer. The collector electrodes are each preferably formed of a material having a low resistance to reduce the electrical loss and are preferably arranged in a lattice pattern or a comb pattern. As a material for an electrode having the properties described above, for example, there may be mentioned a metal material such as Al, Ag, Pt, Au, Ni, or Cu; a conductive paste containing particles of the metal mentioned above dispersed in a resin; a conductive carbon paste; or the composite thereof.

As a method for forming the collector electrodes, for example, there may be mentioned a method in which a conductive paste containing metal particles dispersed in a resin or a conductive carbon paste is applied by silk screen printing or the like, followed by heating, or a method in which the paste mentioned above is applied to a metal material and is then processed by hot contact bonding using a hot contact bonding tool.

(Conductive Foil Body)

The conductive foil bodies 106 are additional collector electrodes for the collector electrodes 105 and serve to carry the electrical power generated in the semiconductor layer outside the photovoltaic element. For the conductive foil body, for example, a metal material having a low resistance, such as Al, Ag, Pt, Au, Ni, or Cu, is preferably used.

In addition, at least a part of the conductive foil body, such as a sidewall thereof, may be processed by release treatment. As the release treatment, application of the release agents which has been described for the insulating member is preferably used.

As a method for electrically connecting the collector electrodes to the conductive foil bodies, for example, a method in which connection is performed using a known commercially available conductive paste or the conductive paste used for the collector electrodes, or a method in which connection is performed by soldering, brazing, or the like may be optionally performed.

(Photovoltaic Cell)

A photovoltaic element in which at least a part of the light receiving face is covered with the surface protection coating film described below is called a photovoltaic cell.

(Surface Protection Coating Film)

The surface protection coating film 107 is required to have high scratch resistance for preventing the photovoltaic element from being scratched, high moisture resistance for preventing infiltration of moisture, low moisture permeability, and transparency. The moisture permeability is preferably less than 20 g/m$^2$·day at 40° C. and 90% RH. In addition, in order to suppress the decrease in amount of light incident on the photovoltaic element, the transmittance of the surface protection coating film is preferably 80% or more in a visible wavelength region of 400 to 800 nm. In addition, in order to enable light to easily enter the photovoltaic element from the exterior environment, the refractive index is preferably 1.1 to 2.0, and more preferably 1.1 to 1.6. As a particular material, a resin primarily composed of an acrylic, a silicone, or a fluorinated resin is generally used. As a method for curing the resin, a moisture curing type, a two-component type such as isocyanate curing, and a one-component type using a blocking isocyanate may be mentioned. When a two-component type paint is used, mixing of a resin with a curing agent must be performed just before application, and as a result, a machine therefore also becomes complicated. Accordingly, as a more preferable material for this coating film, a one-component paint containing a resin which is to be cured with a blocking isocyanate by heating may be used. As the resin, an acrylic resin mixed with an inorganic polymer may be used. The dissociation temperature of a blocking agent is preferably in the range of from 80 to 220° C. When the temperature is less than 80° C., a pot life of the resin itself decreases. When the temperature is more than 220° C., heating performed for dissociation may thermally degrade the acrylic resin itself to cause yellow discoloration or may adversely influence the performance of the photovoltaic element in some cases. Since the blocking agent after dissociation partly remains in the coating film, a material should be selected which may not cause discoloration by reaction with the coating film composition. In addition, in order to obtain adhesiveness, silane, titanium, or aluminum coupling agents in an amount of 0.05 to 10 percent by weight with respect to the resin component may be used. A silane coupling agent in an amount of 0.05 to 8.0 percent by weight is preferably used.

As a coating method, a coating material is dissolved in a solvent, such as xylene, methyl isobutyl ketone, toluene, or methyl ethyl ketone, to form a mixture having a viscosity in the range of from 1 to 50 mPa·s, and more preferably in the range of from 10 to 30 mPa·s; the mixture thus obtained is applied onto the photovoltaic element by spray coating, spin coating, or curtain coating, followed by drying to remove the solvent; and the coating material is then cured by heating. By the coating using the mixture described above, the coating material can be supplied in gaps between the collector electrodes formed on the photovoltaic element plate 101, and as a result, the gaps can be filled.

Furthermore, as the average thickness of the coating film, a thickness of 0.5 mm or less is preferable in order not to degrade the transmittance. In general, when being small as described above, the thickness of the film considerably varies from place to place, and depending on temperature conditions for drying and curing or the like, internal bubbles may be disadvantageously generated. However, according to the present invention, a superior effect can be obtained.

EXAMPLES

Hereinafter, with reference to examples, the present invention will be described in detail. However, the examples described below are representative cases of the present invention, and hence the present invention is not limited thereto.

Example 1

Figure 3:
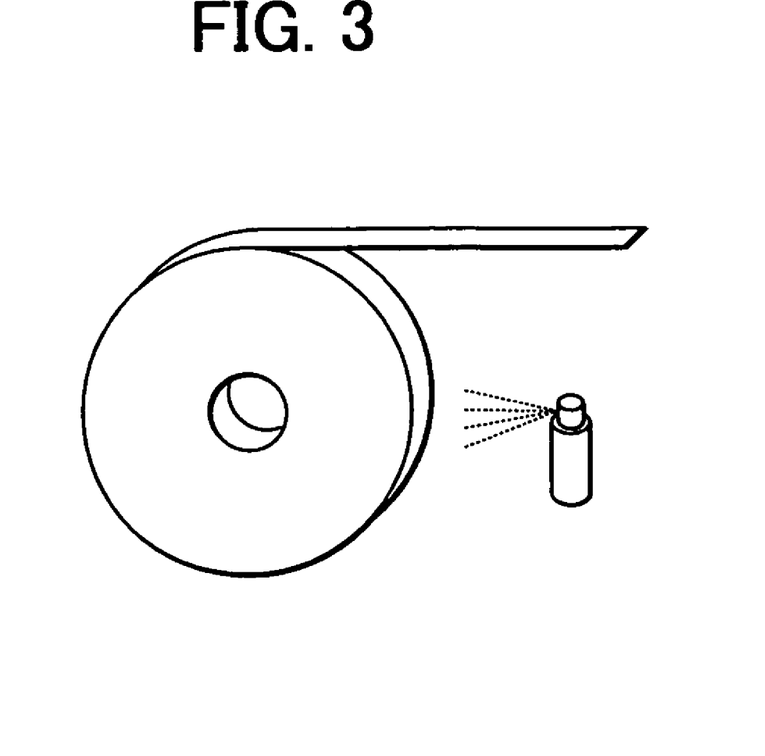
FIG. 3 is a schematic view showing a roll of insulating material of example 1 according to the present invention.

FIGS. 1A to 3 are schematic views for illustrating a photovoltaic element according to example 1 of the present invention; FIG. 1A is a schematic view of a photovoltaic cell having collector electrodes made of metal wires when it is viewed from a light receiving face side; FIG. 1B is a schematic cross-sectional view of the photovoltaic cell taken along the line 1B-1B' in FIG. 1A; FIG. 2 is an enlarged, schematic cross-sectional view of an insulating member forming an electrode portion of a photovoltaic cell; and FIG. 3 is a schematic view showing a long insulating material having a narrow width in the form of a roll obtained by slitting.

In FIGS. 1A and 1B, reference numeral 101 indicates a photovoltaic element plate having a size of 200 mm by 250 mm, containing three layers, that is, a lower electrode layer, an amorphous silicon layer responsible for a photovoltaic function, and an upper electrode layer.

The photovoltaic element plate 101 was composed of a stainless steel substrate 150 μm thick supporting the entire photovoltaic element plate and Al and ZnO layers provided thereon in that order by deposition, the Al and ZnO layers each having a thickness of approximately several hundred nanometers and collectively forming the lower electrode layer. In addition, the amorphous silicon layer was formed by depositing an n-type, an i-type, a p-type, an n-type, an i-type, and a p-type layer in that order from the substrate side using a plasma CVD method, and the thicknesses thereof were approximately 15, 400, 10, 10, 80, and 10 nm, respectively. The upper electrode layer was a transparent electrode film and was formed by depositing In (indium) in an oxygen atmosphere using a resistance heating method, thereby obtaining an indium oxide thin film having a thickness of approximately 70 nm.

Furthermore, since short circuiting might occur between the substrate and the transparent electrode film when the outer periphery of the photovoltaic element plate 101 was cut, in order to avoid adverse influences of the short circuiting on an effective light receiving region, after an etching paste containing $FeCl_3$, $AlCl_3$, or the like was applied onto the transparent electrode film by a screen printing method, followed by heating, washing was performed so that parts of the transparent electrode film of the photovoltaic element plate 101 were linearly removed, thereby forming etching lines (not shown).

Subsequently, along two sides of a non-light receiving face of the photovoltaic element plate 101, copper strips 5 mm wide, 200 mm long, and 100 μm thick used as rear-side conductive foil bodies 103 were formed.

Next, to two sides facing the rear-side conductive foil bodies 103 provided along the two sides of the non-light receiving face of the photovoltaic element plate 101, the insulating members 104 were adhered. As shown in FIG. 2, the insulating member 104 was a tape having a total thickness of 150 μm composed a polyimide 211 having a thickness of 50 μm and acrylic resin agents 210 and 212 provided on the two sides of the polyimide 211 and each having a thickness of 50 μm. In addition, the insulating member 104 was coated with a silicone release agent 213 at a sidewall thereof with which a surface protection coating film is brought into contact.

As a method for applying the silicone release agent 213, as shown in FIG. 3, a mixture containing 95 percent by weight of toluene and 5 percent by weight of a silicone release agent was prepared beforehand and was then uniformly applied onto one side of a roll of insulating material having a width of 8 mm and a length of 200 m, followed by drying in an oven at a temperature of 100° C. for 30 minutes. The insulating material provided with the release agent described above was cut into pieces 200 mm long, and the insulating material having a length of 200 mm thus formed was adhered to the photovoltaic element plate 101 so that the side surface provided with the release agent was located at the side which is brought into contact with the surface protection coating film, thereby forming the insulating member 104.

Next, metal wires 105 each coated with a conductive adhesive, which were formed by applying a conductive adhesive made of a carbon paste onto copper wires 100 μm in diameter, were continuously formed on the photovoltaic element plate 101 and the insulating members 104 at intervals of 20 mm, thereby forming the collector electrodes.

Furthermore, on each insulating member 104, the conductive foil body 106 functioning as an additional collector electrode for the collector electrodes was formed. In particular, copper strips 5 mm wide, 190 mm long, and 100 μm thick for forming the conductive foil bodies 106 were placed at predetermined positions, and the entire photovoltaic element was then fixed by applying heat and pressure at 200° C. and 0.098 Mpa for 120 seconds, thereby forming the photovoltaic element.

Next, surface protection coating was performed on the light receiving face of the photovoltaic element. Reference numeral 107 indicates a surface protection coating film. A coating solution was prepared by adding a mixed solvent of 50 percent by weight of xylene and 50 percent by weight of methyl isobutyl ketone to a resin component containing 52 percent by weight of an acrylic resin made of 2-hydroxyethyl methacrylate, 30 percent by weight of hexamethylene diisocyanate using e-caprolactam as a blocking agent, 13 percent by weight of organosiloxane, and 5 percent by weight of γ-glycidoxypropyltrimethoxysilane so that the resin component was 35 percent by weight, and subsequently, spray coating was performed onto a power generation region of the photovoltaic element so as to obtain a coating film having a thickness of 25 μm after curing.

When a surface protection coating material was applied, due to the surface tension of the sidewall of the insulating member 104 obtained by the presence of the release agent applied to the insulating member, the coating material in the vicinity of the insulating member 104 did not ascend along the sidewall described above and was repelled therefrom by the presence of the release agent, and as a result, the thickness of coating film in the vicinity of the insulating member 104 was reduced. A photovoltaic element coated with a coating material as described above was dried at room temperature for 15 minutes, followed by heating for curing at 200° C. for 10 minutes, thereby forming the photovoltaic cell 100.

By the structure and the method described above, the surface protection coating could be performed for the photovoltaic element without generating any internal bubbles even in the vicinity of the electrode portion. In particular, for example, when the primary component of the surface protection coating film is an acrylic resin and the adhesive of the insulating member is the same type as the above resin, such as an acrylic adhesive, since the coating material and the material of the electrode portion are well compatible with each other and have good affinity therebetween, the coating material is liable to be drawn to the electrode portion side, the thickness of the coating film tends to increase, and as a result, the internal bubbles may be easily generated in the vicinity of the electrode portion. However, in the photovoltaic cell having the structure described above, since the release treatment is performed as described in this example, a photovoltaic cell having good appearance and no internal bubbles can be provided.

Example 2

Figure 4:
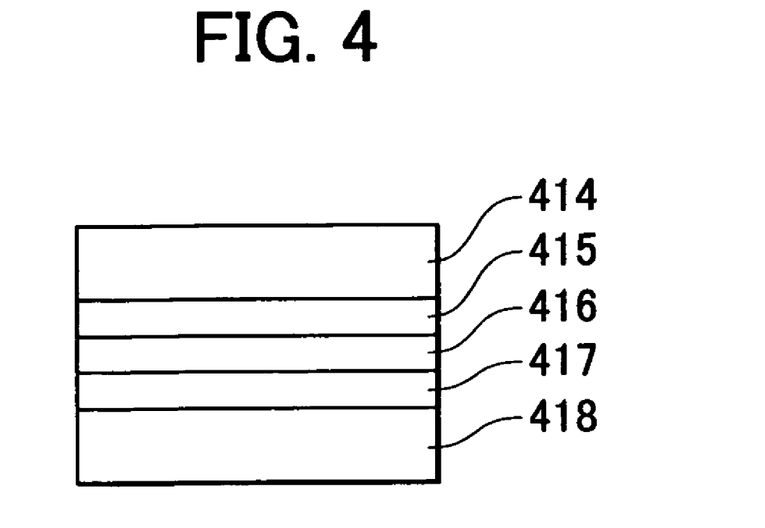
FIG. 4 is a schematic cross-sectional view for illustrating an insulating member of example 2 according to the present invention.

FIG. 4 is an enlarged, schematic cross-sectional view of an insulating member forming an electrode portion of a photovoltaic element according to example 2 of the present invention. A photovoltaic cell of example 2 had the same structure and was formed by the same method as that described in example 1 except that the structure of the insulating member was changed.

The photovoltaic element of example 2 had the same structure as that in example 1, and in order to obtain heat resistance and cushioning property, the insulating member was a tape having a total thickness of 175 μm composed of a base plate, which was formed of a perfluoroalkoxy (PFA) film 415 having a thickness of 25 μm and a polyethylene terephthalate (PET) film 417 having a thickness of 25 μm bonded thereto with an acrylic adhesive 416 having a thickness of 25 μm, and acrylic adhesives 414 and 418 each having a thickness of 50 μm and being provided on the two sides of the base plate. The two surfaces of the perfluoroalkoxy film 415 to which the adhesives were to be adhered were processed by treatment for easy adhesion. In order to form the insulating member described above, for example, a roll having a wide width of 500 mm and a length of 200 m was slit into a tape having a width of 8 mm and a length of 200 m in the form of roll, and the insulating members are formed by cutting the tape described above into pieces having a rectangular shape.

By using the insulating member having the structure described above, when a surface protection coating material was applied, since the sidewall surface of the insulating member was partly composed of the perfluoroalkoxy film 415, the sidewall surface being a surface obtained by slitting, the coating material in the vicinity of the insulating member was repelled, the thickness of the coating material in the vicinity of the insulating member could be reduced, and as a result, the generation of internal bubbles could be prevented when the coating material was cured.

In this example, a part of the base plate located at a position at least higher than the average thickness of the coating film is formed of the perfluoroalkoxy film 415 so as to obtain a release function; however, in addition to the plastic film of the base plate, for example, the adhesive agents 414 and 416 may also have a release function. That is, even when the adhesive 416 of the insulating member is an adhesive formed of an acrylic adhesive mixed with 5 percent by weight of a silicone release agent primarily including dimethyl silicone, the same effect as described above can be obtained. In addition, when the adhesive 414 is mixed with a release agent, the adhesion strength may decrease in some cases. However, when the amount of the release agent mixed with the adhesive 414 is precisely controlled, an adhesive formed of the adhesive 414 and a release agent mixed therewith may be used. As described above, when a release agent is mixed with the adhesive, since the area of the sidewall portion of the insulating member which is processed by release treatment is increased, a release force with respect to the coating material is increased, and as a result, a more preferable effect can be obtained. Furthermore, even when an adhesive mixed with a release agent beforehand is not used, after the tape is formed, for example, an adhesive may be impregnated with a release agent diluted with a solvent such as toluene. In addition, when a known silicone adhesive containing dimethyl silicone as an impurity is at least used for the adhesives 414 and 416, the same effect as that described above can be obtained since the adhesive may have its own release function.

As described above, the photovoltaic cell of the present invention is a photovoltaic cell formed of the photovoltaic element provided with the coating film thereon, the photovoltaic element has the electrode portion having a thickness larger than the average thickness of the coating film, and the thickness of the coating film in contact with the electrode portion is equal to or less than the average thickness described above. Accordingly, when the surface protection coating is dried for curing, internal bubbles are not generated therein in the vicinity of the electrode portion, and as a result, a photovoltaic cell having a superior appearance can be realized. In particular, by applying a known release agent, antifoaming agent, or surfactant, which has a function, for example, of reducing the surface tension so as to prevent the generation of bubbles, onto the electrode portion and the like, or by disposing a known release agent or surfactant, which has an effect of reducing the surface tension, on a part of the sidewall of the electrode portion of the photovoltaic element which is in contact with the coating material, internal bubbles are not generated therein in the vicinity of the electrode portion, and as a result, a photovoltaic cell having a superior appearance can be realized.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A photovoltaic cell comprising:
   a photovoltaic element plate;
   an insulating member provided directly on the photovoltaic element plate;
   a coating film provided on an area of the photovoltaic element plate on which the insulating member is not provided; and
   an electrode formed on the insulating member,
   wherein the insulating member has a thickness larger than the average thickness of the coating film, and
   a thickness of a part of the coating film which is in direct contact with the insulating member is smaller than the average thickness of the coating film.

2. The photovoltaic cell according to claim 1, wherein the coating film comprises a thermosetting coating material, and the thermosetting coating material before curing has a viscosity in the range of from 1 to 50 mPa s.

3. The photovoltaic cell according to claim 1, wherein the average thickness of the coating film is 0.5 mm or less.

4. The photovoltaic cell according to claim 1, wherein the coating film comprises a coating material containing at least an acrylic resin.

5. The photovoltaic cell according to claim 1, wherein the coating film comprises a coating material, and the electrode comprises a conductive foil body.

6. The photovoltaic cell according to claim 5, wherein the insulating member comprises an acrylic adhesive layer.

7. The photovoltaic cell according to claim 5, wherein a part of the insulating member located at a position higher than the average thickness of the coating film has a low wettability to the coating material.

8. The photovoltaic cell according to claim 7, wherein a side surface of the insulating member comprises an agent causing the side surface of the insulating member to have a low wettability to the coating material, the side surface of the insulating member being located at a side of the insulating member which is in contact with the coating film.

9. The photovoltaic cell according to claim 8, wherein the insulating member includes a base plate comprising the agent.

10. A method for manufacturing a photovoltaic cell having a photovoltaic element plate, an insulating member provided directly on the photovoltaic element plate, a coating film provided on an area of the photovoltaic element plate on which the insulating member is not provided, and an electrode formed on the insulating member, comprising:

a step of forming the coating film on a light receiving face of the photovoltaic element plate by applying the coating film thereon; and a step of heating the coating film for curing while a part thereof in direct contact with the insulating member is being maintained such that it has a thickness smaller than the average thickness of the coating film.

11. The method for manufacturing a photovoltaic cell according to claim 10, further comprising a step of coating a side surface of the insulating member with an agent which causes the side surface of the insulating member to have a low wettability to a coating material contained in the coating film, wherein the side surface of the insulating member is located at a side of the insulating member which is brought into contact with the coating film.

12. The method for manufacturing a photovoltaic cell according to claim 11, wherein the agent is a release agent contained in a mixed solution at a concentration of 0.1 to 30 percent.

13. The method for manufacturing a photovoltaic cell according to claim 10, further comprising a step of forming the insulating member of the electrode portion by slitting a tape comprising a base plate, wherein the base plate and a side surface of the insulating member comprise an agent which causes the side surface of the insulating member to have a low wettability to a coating material contained in the coating film, and wherein the side surface of the insulating member is located at a side of the insulating member which is brought into contact with the coating film.

14. A photovoltaic cell comprising:

a photovoltaic element having a photovoltaic element plate;

an insulating member provided directly on the photovoltaic element plate;

a coating film provided on an area of the photovoltaic element plate on which the insulating member is not provided; and an electrode formed on the insulating member, wherein the insulating member has a thickness larger than the average thickness of the coating film, a thickness of a part of the coating film which is in direct contact with the insulating member is equal to or smaller than the average thickness of the coating film, the electrode is provided outside of a power generation region of the photovoltaic element, the photovoltaic element has collector electrodes on the power generation region, and the coating film covers the power generation region and the collector electrodes.

* * * * *